United States Patent [19]

Hermann et al.

[11] Patent Number: 5,082,825
[45] Date of Patent: Jan. 21, 1992

[54] PROCESS FOR MAKING Tl-BA-CA-CU-O SUPERCONDUCTORS

[75] Inventors: Allen M. Hermann; Zhengzhi Sheng, both of Fayetteville, Ark.

[73] Assignee: University of Arkansas, Little Rock, Ark.

[21] Appl. No.: 236,507

[22] Filed: Aug. 25, 1988

[51] Int. Cl.$^5$ .................. C01F 11/02; C01G 3/02; C01G 15/00

[52] U.S. Cl. .................. 505/1; 252/521; 423/604; 423/624; 423/635; 501/123; 505/725; 505/783

[58] Field of Search ............... 252/521; 423/624, 604, 423/635; 502/341, 346, 354; 505/1, 783; 501/123

[56] References Cited

U.S. PATENT DOCUMENTS 4,870,052  9/1989  Engler .................................. 252/521

OTHER PUBLICATIONS

Shih "Multilayer Deposition of Thallium Barium Calcium Copper-Oxide" Appl. Phys. Lett. vol. 53 (6) pp. 523-525 (Abstract-Aug. 1988).
Ginley "Sequential Electron Beam Evaporated Films of $Tl_2CaBa_2Cu_2O_y$" Appl. Phys. Lett. 53 (5) Aug. 1, 1988 pp. 406-408.
Qiu "Formation of Tl-Ca-Ba-Cu-O Films by Diffusion . . ." Appl. Phys. Lett. 53(12) Sep. 19, 1988 pp. 1122-1124.
Gopalakrishnan "Synthesis and Properties of a 125 K Super-Conductor" Appl. Phys. Lett. vol. 53(5) Aug. 1, 1988 pp. 414-416.
Parkin "Bulk Superconductivity at 125 K in $Tl_2Ca_2Ba_2Cu_3O_x$" Phys. Rev. Lett. vol. 60 No. 24 Jun. 13, 1988 pp. 2539-2542.
Y. Saito et al., High-$T_c$ Superconducting Properties In $(Y_{1-x}Tl_x)$-$Ba_2Cu_3O_{7-y}$, $Y(Ba_{1-x}K_x)_2Cu_3O_{7-y}$ and $YBa_2(Cu_{1-x}Mg_x)_3O_{7-y}$, Physica 148B (1987) 336-338.
S. Kondoh et al., Superconductivity in Tl-Ba-Cu-O System, Solid State Communications, vol. 65, No. 11, pp. 1329-1331, 1988.
M. Sera et al., On the Structure of High-$T_c$ Oxide System Tl-Ba-Cu-O.
Hasegawa, T., High Tc Superconductivity of $(La_{1-x}Sr_x)_2CuO_4$-Effect of Substitution of Foreign Ions for Cu and LA on Superconductivity, Japan Journal of Applied Physics, 26, No. 4, Apr. 20, 1987, L337-338.
Kishio, K., Effect of Lanthanide Ion Substitutions for Lanthanum Sites on Superconductivity of $(La_{1-x}Sr_x)_2CuO_{4-\delta}$, Japan Journal of Applied Physics, 26, No. 4, Apr. 20, 1987, L391-393.
Ohshima, S., Superconducting and Structural Properties of the New $Ba_{1-x}Ln_xCuO_{3-y}$ Compound System (Ln=La, Ce, Pr, Nd, Sm, Eu, Gd, Tb, Dy, Ho, Er, and Yb), Japan Journal Applied Physics, 26, No. 5, May 20, 1987, L815-L817.
Tsurumi, S., High Tc Superconductivities of $A_2Ba_4Cu_6O_{14}$, Japan Journal Applied Physics, 26, No. 5, L856-857.
Superconductivity News, vol. 1, No. 2, Aug. 1987, pp. 1, 2, and 6-8.
K. N. Yang, High Temperature Superconductivity in Rare Earth (R)-Barium Copper Oxides $(RBa_2)Cu_3O_{9-\delta}$, Solid State Comm., vol. 63, No. 6, pp. 515-519 (1987).
J. M. Ferrira, Long-Range Magnetic Ordering in the High-$T_c$ Superconductors $RBa_2Cu_3O_{7-\delta}$ (R=Nd, Sm, Gd, Dy, and Er), The American Physical Society 1988, vol. 37, No. 4.
J. M. Tarascon, Oxygen and Rare-Earth Doping of the 90-K Superconducting Perovskite $YBa_2Cu_3O_{7-x}$, The American Physical Society, 1987, vol. 36, No. 1.
P. H. Hor, Superconductivity Above 90 K in the Square-Planar Compound System $ABa_2Cu_3O_{6+x}$ with A=Y, La, Nd, Sm, Eu, Gd, Ho, Er, and Lu, The American Physical Society, 1987, vol. 58, No. 18.
A. Khurana, Superconductivity Seen Above the Boiling Point of Nitrogen, Physics Today, Apr. 1987.
R. J. Cava, Bulk Superconductivity of 91 K in Single Phase Oxygen-Deficient Perovskite $Ba_2YCu_3O_{9-\delta}$, The American Physical Society, 1987, vol. 58 No. 16.

Primary Examiner—Paul Lieberman
Assistant Examiner—John Boyd
Attorney, Agent, or Firm—Hermann Ivester, Hill, Van Santen, Steadman & Simpson

[57] ABSTRACT

A process of making high-temperature Tl-based superconductors. The process includes the steps of reacting solid Ba-Ca-Cu-oxides with $Tl_2O_3$ vapor. The process allows high quality Tl-based superconductors to be easily fabricated.

22 Claims, 3 Drawing Sheets $Tl_2O_3$-Vapor-processed $Ba_2Ca_2Cu_3O_7$ $Tl_2O_3$-Vapor-processed $BaCa_3Cu_3O_7$

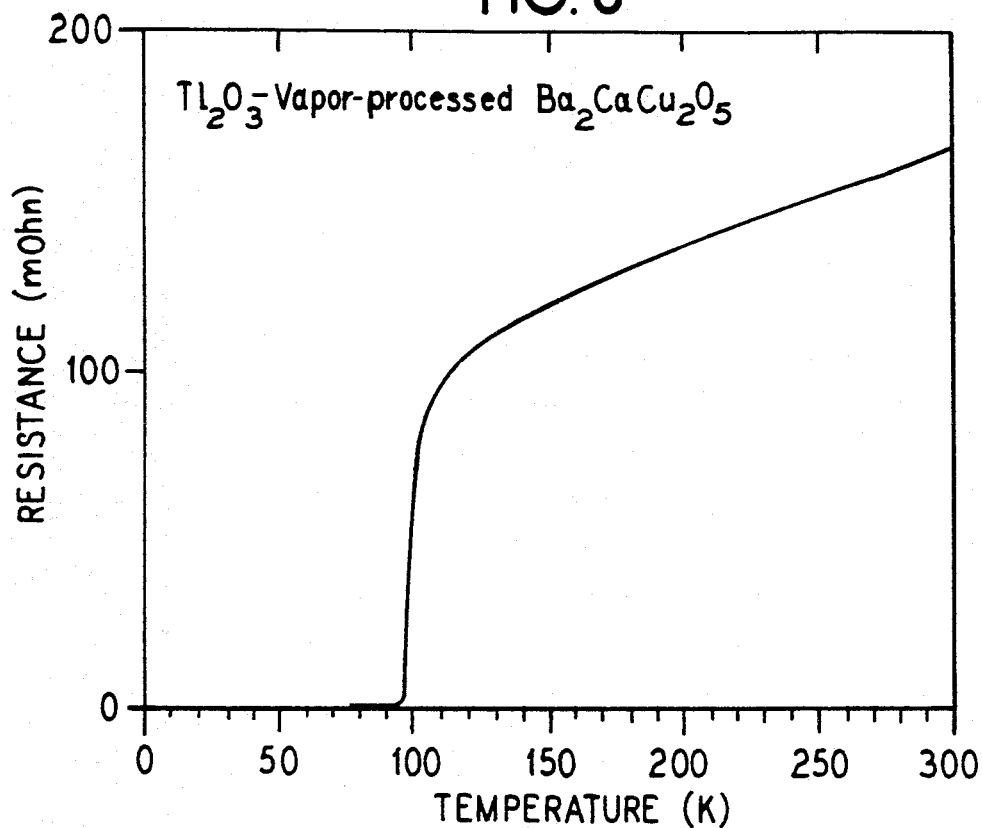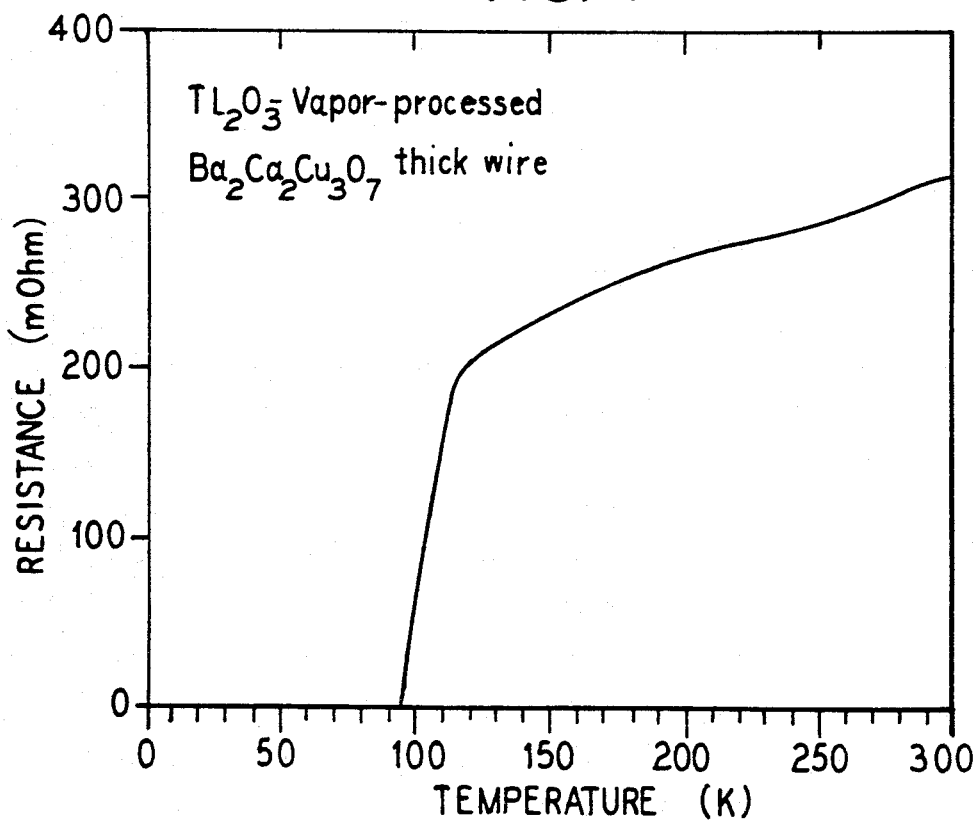

PROCESS FOR MAKING Tl-BA-CA-CU-O SUPERCONDUCTORS

BACKGROUND OF THE INVENTION

The present invention relates generally to high temperature superconductors. More specifically, the present invention relates to the fabrication of the high temperature Tl-Ba-Ca-Cu-O superconductors.

U.S. Pat. Application Ser. No. 155,247, filed in the name of the inventors, of the present patent application discloses, in part, Tl-Ba-Ca-Cu-O superconductors that were discovered by the present inventors. These Tl-Ba-Ca-Cu-O superconductors have a transition temperature up to and above 120 K, this transition temperature, the inventors of the present patent application believe, is the highest to date among all existing high temperature superconductors.

For useful operation, the transition temperature of a superconductor typically must be at least ⅓ higher than the temperature of operation. For this reason, the Tl-Ba-Ca-Cu-O system has been called the first real liquid nitrogen temperature superconducting system.

The present existing procedures of preparing Tl-based superconductors involve the mixing of all component elements followed by a final sinter. Since $Tl_2O_3$ evaporates easily, the qualiy of the Tl-samples is not easily controlled. In addition, in view of its toxicity, $Tl_2O_3$ presents an additional set of difficulties during the fabrication of these types of superconductors.

An improved method for making Tl-Ba-Ca-Cu-O superconductors would be desirable for many reasons. Such a process would: (1) allow Tl-based superconductors to be easily constructed in the forms of complex bulk components, wires and fibers, and thick and thin films; (2) minimize the toxicity problem caused by Tl compounds; and (3) provide low cost processing and manufacturability.

Accordingly, there is a need for a new process of making Tl-based high temperature superconductors.

SUMMARY OF THE INVENTION

The present invention provides a new process for making Tl-based superconductors. The process includes the step of reacting vapor phase $Tl_2O_3$ and solid Ba-Ca-Cu-oxides. Pursuant to the method of the present invention the Tl-based superconductors are produced in approximately two steps. The first step is the preparation of Ba-Ca-Cu-oxides; and the second step is the processing of the Ba-Ca-Cu-oxides by the use of $Tl_2O_3$ vapor to form high quality Tl-based superconductors. Pursuant to the present invention, the method of making Tl-based superconductors is simplified and only requires the manufacture of Ba-Ca-Cu-oxides and a final $Tl_2O_3$ vapor phase treatment.

Accordingly, an advantage of the present invention is that it provides a method which can easily produce Tl-based superconductors.

A further advantage of the present invention is to provide high quality Tl-based superconductors.

A still further advantage of the present invention is that it provides a method which can make Tl-based superconductors in the forms of bulk materials, wires or fibers, thick and thin films.

Furthermore, an advantage of the present invention is that certain elements can be added into the precursor Ba-Ca-Cu-oxides to satisfy specific needs for various applications.

An additional advantage of the present invention is that the Ba-Ca-Cu-oxides can be made in the recrystalline form of a melt.

Still another advantage of the present invention is that $Tl_2O_3$-vapor-processing can be carried out in closed containers.

Yet another advantage of the present invention is that it provides a method of making Tl-based superconductors which minimizes contamination by Tl compounds.

Additional advantages and features of the present invention are described in and will be apparent from, the detailed description of the presently preferred embodiments and the drawings.

BRIEF DESCRIPTION OF THE DRAWING

FIG. 3 illustrates the relationship of electrical resistance versus temperature for a $Tl_2O_3$-vapor-processed $Ba_2CaCu_2O_5$ sample made pursuant to the method of the present invention.

FIG. 4 illustrates resistance-temperature dependence for a $Tl_2O_3$-vapor-processed $Ba_2Ca_2Cu_3O_7$ thick wire sample made pursuant to the method of the present invention.

DETAILED DESCRIPTION OF THE PRESENTLY PREFERRED EMBODIMENTS

Figure 1:
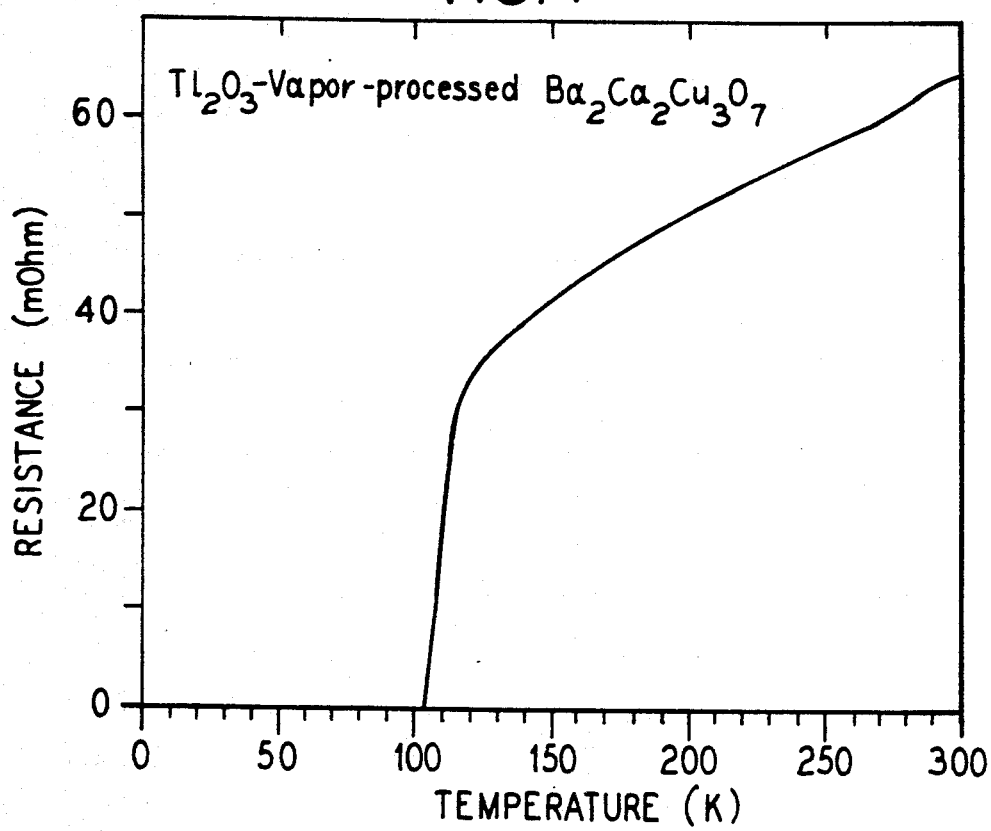
FIG. 1 illustrates the relationship of electrical resistance versus temperature for a $Tl_2O_3$-vapor-processed $Ba_2Ca_2Cu_3O_7$ sample made pursuant to the method of the present invention

The present invention provides a method for making high quality Tl-Ba-Ca-Cu-O superconductors. The present invention is based on reactions between vapor phase $Tl_2O_3$ and solid Ba-Ca-Cu-oxides. The fabrication procedure for the making TI-Ba-Ca-Cu-O superconductors according to the present invention can be divided into two steps: (1) preparation of Ba-Ca-Cu-oxides; and (2) $Tl_2O_3$-vapor-processing of the Ba-Ca-Cu-oxides to form Tl-Ba-Ca-Cu-O superconductors. The present invention simplifies the fabrication of Tl-Ba-Ca-Cu-oxides to the fabrication of Ba-Ca-Cu-oxides, and minimizes problems caused by the toxicity and volatility of Tl compounds. The present invention allows high quality Tl-based superconductors to be easily made in the forms of complex bulk components, wires and fibers, and thick and thin films, and provides low cost processing and manufacturability of Tl-based superconductors.

Pursuant to the method of the present invention, first Ba-Ca-Cu-oxides are produced. Preferably compounds, the Ba-Ca-Cu-oxides are produced by grinding and mixing one of the following groups of: $BaCO_3$, CaO, CuO; $BaCO_3$, $CaCO_3$, CuO; $BaO_2$, $CaO_2$, CuO; or $BaO_2$, CaO, CuO. In a preferred embodiment, the molar ratio is 2:2:3, respectively, of the components. In an embodiment, the molar ratio of $BaCO_3$, CaO, CuO is 1:3:3.

Preferably, after the grinding and mixing the powder is heated. Preferably the powder is heated to approximately 925° C. for approximately 24 to about 48 hours with intermediate grindings.

In an embodiment the resultant powder has the following nominal composition:

$$BaCa_xCu_yO_{1+x+y}$$

wherein: $0 < X < 100$; and $0 < y < 100$.

In an embodiment, the powder is then pressed into a pellet.

After the powder is prepared, or pressed into a pellet, it can then be reacted with $Tl_2O_3$ vapor. The $Tl_2O_3$ vapor can be produced by heating $Tl_2O_3$ with the Ba-Ca-Cu-oxides or heating any Tl-containing compound that can form $Tl_2O_3$ vapor upon being heated to, for example, approximately 900 ° C.

In an embodiment, prior to being reacted with $Tl_2O_3$ vapor, the powder is mixed with a compound chosen from the group consisting of: $Tl_2O_3$, MgO, AgO, $K_2O$, $Na_2O$, $ZrO_2$, $In_2O_3$, HgO, $Bi_2O_3$, and KCl. The resultant mixture is then reacted with $Tl_2O_3$ vapor.

By way of example and not limitation, examples of the of the present invention process of making high quality Tl-Ca-Ba-Cu-O superconductors will now be given.

EXAMPLE I

A. The following reagents were utilized:
1. $Tl_2O_3$,
2. CaO,
3. $BaCO_3$,
4. CuO.

B. The following procedure was followed:
1. A mixture of a two molar portion of $BaCO_3$, a two molar portion of CaO, and a three molar portion of CuO was ground with an agate mortar and pestle, heated in air at 925 ° C. for more than 24 hours (with several intermediate grindings) to obtain an uniform black $Ba_2Ca_2Cu_3O_7$ powder.

2. The resulting $Ba_2Ca_2Cu_3O_7$ powder was completely ground, and pressed into a pellet.

3. The pellet was heated at about 925 ° C. in a tube furnace for about 10 minutes.

4. The heated pellet was then taken out of the furnace and cooled in air to room temperature.

5. A small amount (approximately 0.1 to about 0.2 gm) of $Tl_2O_3$ was put in a platinum boat and the platinum boat was placed in a quartz boat.

6. The cooled pellet was placed over the platinum boat.

7. The quartz boat, containing the platinum boat, was placed into a tube furnace which had been heated to about 900 ° C., and was heated for about 3 minutes in flowing oxygen.

8. The sample was then furnace-cooled to room temperature in flowing oxygen, the sample was then taken out of the furnace.

The samples prepared by this procedure formed a layer of superconductive compounds on their bottom surface, which had an onset temperature of above 120 k and a zero resistance temperature of above 100 k. FIG. 1 illustrates the resistance as a function of temperature for a $Tl_2O_3$-vapor-processed $Ba_2Ca_2Cu_3O_7$ sample made pursuant to this example. This sample reaches zero resistance at 104 k. FIG. 4 illustrates comparable behavior for a $Ba_2$, $Ca_2$, $Cu_3O_7$ thick wire as a precursor made by a similar procedure.

EXAMPLE 2

A. The following reagents were utilized:
1. $Tl_2O_3$,
2. CaO
3. $BaCO_3$,
4. CuO.

B. The following procedure was followed:
1. A mixture of a one molar portion of $BaCO_3$, a three molar portion of CaO, and a three molar portion of CuO was ground with an agate mortar and pestle, heated in air at 925 ° C. for more than 24 hours (with several intermediate grindings) to obtain a uniform black $BaCa_3Cu_3O_7$ powder.

2. The resulting $BaCa_4Cu_3O_7$ powder was completely ground, and pressed into a pellet.

3. The pellet was heated at approximately 925° C. in a tube furnace for about 10 minutes.

4. The heated pellet was then taken out of the furnace and cooled in air to room temperature.

5. A small amount (approximately 0.1 to about 0.2 gm) of $Tl_2O_3$ was placed in a platinum boat, and the platinum boat was then placed in a quartz boat.

6. The cooled pellet was placed over the platinum boat.

7. The quartz boat was put into the tube furnace which had been heated to about 900 ° C., and was heated for about 3 minutes in flowing oxygen.

8. The sample was then furnace-cooled to room temperature in flowing oxygen, and the sample was then taken out of the furnace.

Figure 2:
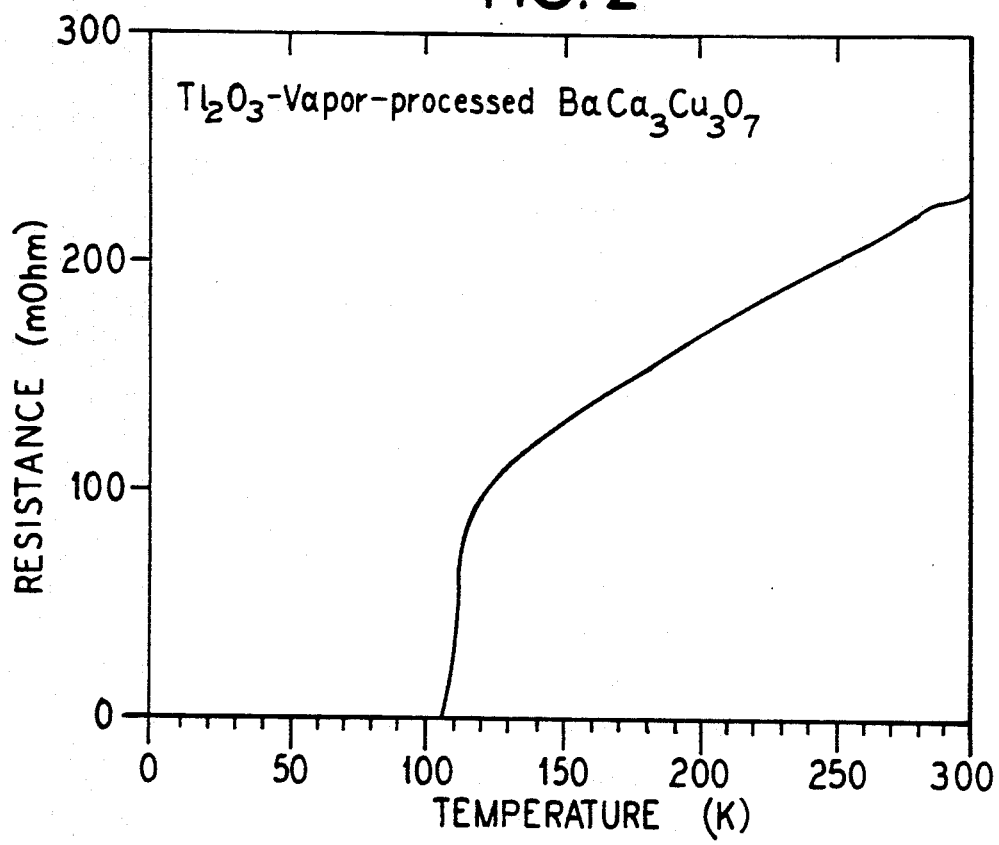
FIG. 2 illustrates the relationship of electrical resistance versus temperature for a $Tl_2O_3$-vapor-processed $BaCa_2Cu_3O_7$ sample made pursuant to the method of the present invention.

The samples prepared by this procedure formed a layer of superconductive compounds on their bottom surface, which had an onset temperature of above 120 K, a midpoint of about 110 K, and a zero resistance temperature of above 100 K. FIG. 2 illustrates resistance as a function of temperature for a $Tl_2O_3$-vapor-processed $BaCa_3Cu_3O_7$ sample prepared pursuant to this example. This sample reaches zero resistance at 110 K. FIG. 3 illustrates comparable behavior for a $Ba_2CaCu_2O_5$ precursor similarly prepared.

EXAMPLE 3

A. The following reagents were utilized:
1. $Tl_2O_3$,
2. $CaCO_3$,
3. $BaCO_3$,
4. CuO.

B. The following procedure was followed:
1. A mixture of a two molar portion of $BaCO_3$, a two molar portion of $CaCO_3$, and a three molar portion of CuO was ground with an agate mortar and pestle, heated in air at approximately 925° C. for more than 24 hours (with several intermediate grindings) to obtain a uniform black $Ba_2Ca_2Cu_3 O_7$ powder.

2. The resulting $Ba_2Ca_2Cu_3O_7$ powder was completely ground, and pressed into a pellet 3. The pellet was heated at approximately 925° C. in a tube furnace for about 10 minutes.

4. The heated pellet was then taken out of the furnace and cooled in air to room temperature.

5. A small amount (approximately 0.1 to about 0.2 gm) of $Tl_2O_3$ was put in a platinum boat, and the platinum boat was placed in a quartz boat.

6. The cooled pellet was placed over the platinum boat.

7. The quartz boat was put into the tube furnace which had been heated to approximately 900° C., and was heated for about 3 minutes in flowing oxygen.

8. The sample was then furnace-cooled to room temperature in flowing oxygen, and was then removed from the furnace.

The samples prepared by this procedure formed a layer of superconductive compounds on their bottom surface, which have an onset temperature of above 120 K, a midpoint of about 110 K, and a zero resistance temperature of above 100 K.

EXAMPLE 4

A. The following reagents were utilized:
1. $Tl_2O_3$,
2. CaO,
3. $BaCO_3$,
4. CuO.

B. The following procedure was followed:

1. A mixture of a two polar portion of $BaCO_3$, a two molar portion of CaO, and a three molar portion of CuO was ground with an agate mortar and pestle, heated in air at 925° C. for more than 24 hours (with several intermediate grindings) to obtain a uniform black $Ba_2Ca_2Cu_3O_7$ powder.

2. The resulting $Ba_2Ca_2Cu_3$ powder was placed on a platinum substrate which was put in a quartz boat, and was heated in a tube furnace at approximately 95° to about 1000° C. for 3-5 minutes in flowing oxygen.

3. The quartz boat was then taken out of the furnace. The $Ba_2Ca_2Cu_3O_7$ powder had melted completely, forming a layer of recrystalline Ba-Ca-Cu-O.

4. A small amount (approximately 0.1 to about 0.2 gm) of $Tl_2O_3$ was put in a platinum boat, and the platinum boat was placed in a quartz boat.

5. The platinum substrate was put over the platinum boat with the molten Ba-Ca-Cu-O facing downward.

6. The quartz boat was put into the tube furnace which had been heated to about 900° C., and was heated for about 3 minutes in flowing oxygen.

7. The sample was then furnace-cooled to room temperature in flowing oxygen, and was then taken out of the furnace.

Figure 5:
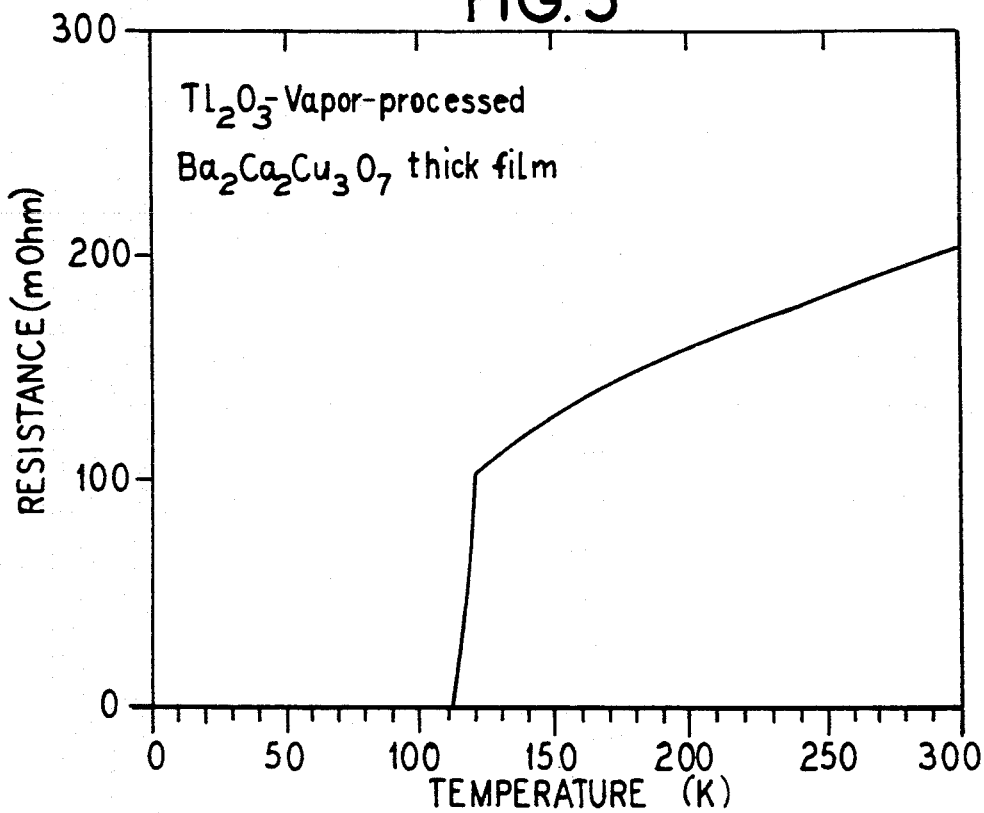
FIG. 5 illustrates resistance-temperature dependence for a $Tl_2O_3$-vapor-processed $Ba_2Ca_2Cu_3O_7$ recrystallized thick film sample made pursuant to the method of the present invention.

A $Tl_2O_3$-vapor-processed $Ba_2Ca_2Cu_3O_7$ thick film was produced that was superconducting. FIG. 5 illustrates resistance as a function of temperature for a $Tl_2O_3$-vapor-processed $Ba_2Ca_2Cu_3O_7$ recrystallized thick to this example. The film had an onset temperature of above 120 K and reached zero resistance at about 111 K.

This experiment also shows that thin film Tl-Ca-Ba-Cu-O superconductors can be made using the $Tl_2O_3$ vapor process with appropriately deposited Ca-Ba-Cu-O precursor thin films. These thin films can be produced by depositing a thin-film of Ca-Ba-Cu-O precursor utilizing known techniques of physical vapor deposition. These techniques include, inter alia, sputtering, evaporation, ablation, electrodeposition, electroless deposition, and chemical vapor deposition. After the thin film of Ca-Ba-Cu-O is produced, it can then be reacted with $Tl_2O_3$ vapor, for example, by placing $Tl_2O_3$ in a boat under or near the precursor and heating the boat.

EXAMPLE 5

A. The following reagents were utilized:
1. $Tl_2O_3$,
2. $In_2O_3$,
3. CaO,
4. $BaCO_3$,
5. CuO.

B. The following procedure was followed:

1. A mixture of two molar portion of $BaCO_3$, a two molar portion of CaO, and a three molar portion of CuO was ground with an agate mortar and pestle, heated in air at approximately 925° C. for more than 24 hours (with several intermediate grindings) to obtain a uniform black $Ba_2Ca_2Cu_3O_7$ powder.

2. A one molar portion of the resulting $Ba_2Ca_2Cu_3O_7$ powder was mixed with a one molar portion of $In_2O_3$, and was completely ground and pressed into a pellet.

3. The pellet was heated in a tube furnace at about 900° C. in flowing oxygen for about 3 minutes, and was then removed from the furnace.

4. A small amount (approximately 0.1 to about 0.2 gm) of $Tl_2O_3$ was put in a platinum boat, and the platinum boat was put in a quartz boat.

5. The $In_2Ba_2Ca_2Cu_3O_7$ pellet was put over the platinum boat.

6. The quartz boat was then put into the tube furnace which had been heated to approximately 900° C., and was heated for about 3 minutes in flowing oxygen.

7. The sample was then furnace-cooled to room temperature in flowing oxygen, and was then removed from the furnace.

Figure 6:
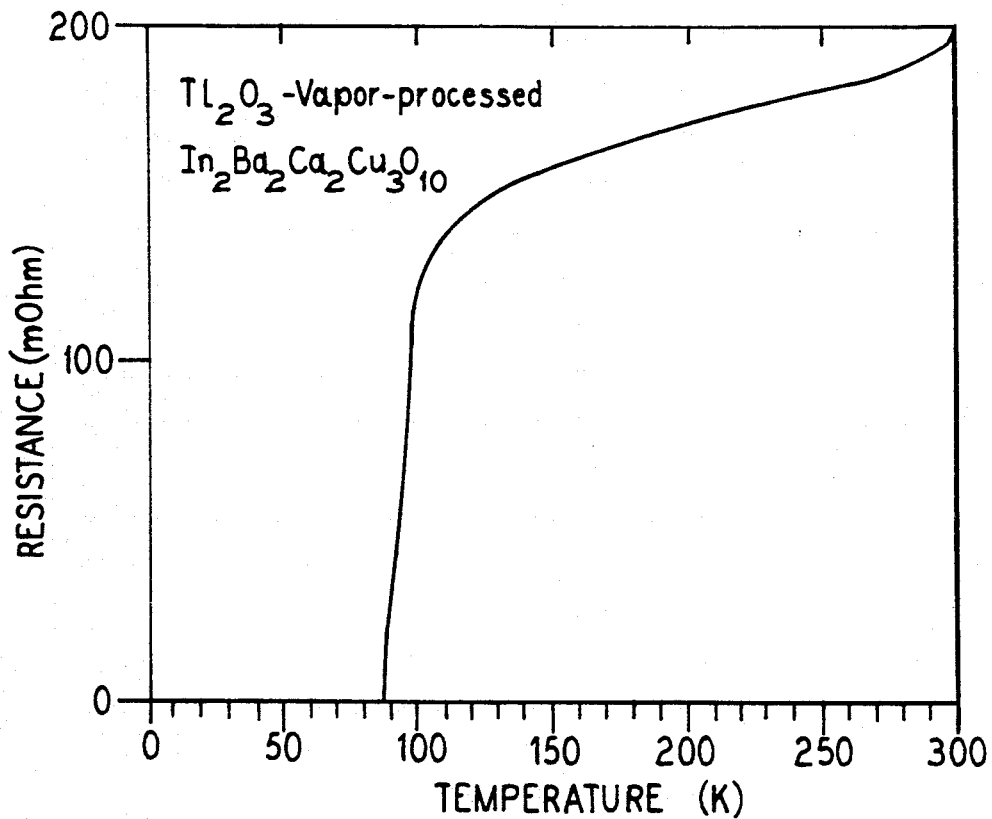
FIG. 6 illustrates resistance as a function of temperature for a $Tl_2O_3$-vapor-processed $In_2Ba_2Ca_2Cu_3O_{10}$ sample made pursuant to the present invention.

The bottom surface of the $Tl_2O_3$-vapor-processed $In_2Ba_2Ca_2Cu_3O_7$ sample constructed pursuant to this method was found to be superconducting. FIG. 6 illustrates resistance as a junction of temperature for a $Tl_2O_3$-vapor-processed $In_2Ba_2Ca_2Cu_3O_7$ sample, made pursuant to this example, which had an onset temperature about 120 K, and reached zero resistance at 89 K.

EXAMPLE 6

A. The following reagents were utilized:
1. $Tl_2O_3$,
2. CaO,
3. $BaCO_3$,
4. CuO.

B. The following procedure was followed:

1. A mixture of a two molar portion of $BaCO_3$, a two molar portion of CaO, and a three molar portion of CuO was ground with an mortar and pestle, heated in air at 925° C. for more than 24 hours (with several intermediate grindings) to obtain a uniform black $Ba_2Ca_2Bu_3O_7$ powder.

2. The resulting $Ba_2Ca_2Cu_3O_7$ powder was completely ground, and pressed into a pellet.

3. The pellet was heated in a tube furnace at approximately 925° C. for about 5 minutes.

4. The pellet was then taken out of the furnace and cooled in air to room temperature.

5. A small amount (approximately 0.1 to about 0.2 gm) of $Tl_2O_3$ was put in a platinum boat, and the platinum boat and cooled pellet were put in a gold container.

6. The gold container, was sealed so that the platinum boat and pellet were sealed in oxygen, was put into a tube furnace which had been heated to approximately 900° C., and was heated for about 10 minutes.

7. The gold container was then furnace-cooled to room temperature, and was removed from the furnace.

8. The gold container was opened, and the sample taken out.

This example produced a $Tl_2O_3$-vapor-processed sample that formed a layer of superconducting compounds on its surface, which had an onset temperature of above 120 K and a zero resistance temperature of above 100 K.

EXAMPLE 7

A. The following reagents were utilized:
1. $Tl_2O_3$,
2. CaO,
3. $BaCO_3$,
4. CuO.

B. The following procedure was followed:
1. A mixture of a two molar portion of $BaCO_3$, a two molar portion of CaO, and a three molar portion of CuO was ground with an agate mortar and pestle, heated in air at approximately 925° C. (with several intermediate grindings) to obtain a uniform black $Ba_2Ca_2Cu_3O_7$ powder.
2. The resulting $Ba_2Ca_2Cu_3O_7$ powder was mixed with $Tl_2O_3$ in a molar ratio of 1:1, and was completely ground and pressed into a pellet.
3. The pellet was heated at approximately 925° C. in a tube furnace for approximately 4 hours. The sample could have been heated for a longer time however.
4. The heated pellet was then taken out of the furnace and cooled in air to room temperature. The resultant pellet was found to have a semiconductor behavior.
5. A small amount (approximately 0.1 to about 0.2 gm) of $Tl_2O_3$ was put in a platinum boat, and the platinum boat was put in a quartz boat.
6. The resultant pellet was put over the platinum boat.
7. The quartz boat was then put into the tube furnace which had been heated to approximately 900° C., and was heated for about 3 minutes in flowing oxygen.
8. The sample was then furnace-cooled to room temperature in flowing oxygen, and was then removed from the furnace.

The resulting $Tl_2O_3$-vapor-processed sample, produced by this example, had a superconducting behavior, and had an onset temperature of above 120 K, and a zero resistance temperature of above 100 K.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:
1. A method for making high temperature superconductors comprising the steps of:
   a. grinding a mixture of a compound selected from the group consisting of $CaCo_3$, CaO, a compound selected from the group consisting of $BaCO_3$ and $BaO_2$, and CuO and heating the ground mixture to obtain a uniform black Ba-Ca-Cu-O powder;
   b. pressing the resulting Ba-Ca-Cu-O powder into a pellet;
   c. heating the pellet;
   d. allowing the pellet to cool;
   e. placing the pellet near an amount of $Tl_2O_3$;
   f. heating the pellet and $Tl_2O_3$ so that at least a portion of the $Tl_2O_3$ vaporizes; and
   g. allowing the resultant product to cool.
2. The method of claim 1 wherein the mixture of step a is heated to approximately 925° C.
3. The method of claim 1 wherein the mixture of step a is heated to approximately 925° C. for approximately 24 to about 48 hours.
4. The method of claim 1 wherein the mixture of step a is heated to approximately 925° C. for approximately 24 to about 48 hours with several intermediate grindings.
5. The method of claim 1 wherein the pellet in step c is heated in a tube furnace.
6. The method of claim 1 wherein the pellet in step c is heated at 925° C. for approximately 5 to about 10 minutes.
7. The method of claim 1 including the steps of:
   placing the $Tl_2O_3$ in a platinum boat;
   placing the platinum boat in a quartz boat;
   putting the pellet over the platinum boat; and
   heating the quartz boat to approximately 900° C.
8. The method of claim 7 wherein the quartz boat is heated to approximately 900° C. for approximately 3 to about 5 minutes in flowing oxygen.
9. The method of claim 1 wherein the quartz boat is furnace-cooled to room temperature.
10. The method of claim 1 wherein the powder includes a mixture of $BaCO_3$, CaO, and CuO with a molar ratio of 2:2:3.
11. The method of claim 1 wherein the powder includes a mixture of $BaCO_3$, CaO, CuO with a molar ratio of 1:3:3.
12. The method of claim 1 wherein the powder includes a mixture of $BaO_2$, CaO, and CuO with a molar ratio of 2:2:3.
13. The method of claim 1 wherein the pellet of step d has the following approximate formula:

$$BaCa_xCu_yO_{1+x+y}$$

wherein : $0 < X < 100$; and $0.01 < y < 100$.
14. The method of claim 1 wherein the Ba-Ca-Cu-O powder is mixed with a compound chosen from the group consisting of: $In_2O_3$, $Tl_2O_3$, MgO, AgO, $K_2O$, $Na_2O$, $ZrO_2$, HgO, $Bi_2O_3$ and KCl before being pressed into a pellet
15. The method of claim 1 wherein the pellet in step c is heated to approximately 950° to about 1000 ° C. for approximately 3 to about 10 minutes, and the pellet is melted.
16. The method of claim 1 including the steps of:
   placing the $Tl_2O_3$ in a platinum boat;
   placing the platinum boat in a gold container along with the pellet; and
   heating the gold container.
17. The method of claim 16 including the step of sealing the gold container in oxygen.
18. A method for making high temperature superconductors comprising the steps of:
   a. grinding a mixture of $BaCO_3$, CaO, and CuO and heating the ground mixture to obtain a uniform black Ba-Ca-Cu-O powder;
   b. pressing the resulting Ba-Ca-Cu-O powder into a pellet;
   c. heating the pellet:
   d. cooling the pellet;
   e. placing $Tl_2O_3$ in a platinum boat;
   f. placing the platinum boat in a quartz boat;
   g. putting the pellet over the platinum boat;
   h. heating the quartz boat; and
   i. cooling the quartz boat to room temperature.
19. A method for making high temperature superconductors comprising the steps of:

a. grinding a mixture of $BaCO_3$ $CaCO_3$, and CuO and heating the ground mixture to obtain a uniform black Ba-Ca-Cu-O powder.
b. pressing the resulting Ba-Ca-Cu-O powder into a pellet;
c. heating the pellet;
d. cooling the pellet;
e. placing $Tl_2O_3$ in a platinum boat;
f. the platinum boat in a quartz boat;
g. putting the pellet over the platinum boat;
h. heating the quartz boat; and
i. cooling the quartz boat to room temperature.

20. A method for making high temperature superconductors comprising the steps of:
a. grinding a mixture of $BaCO_3$, CaO, and CuO and heating the ground mixture to obtain a uniform black Ba-Ca-Cu-O powder;
b. placing the resulting Ba-Ca-Cu-O powder on a platinum substrate and in a quartz boat;
c. heating the quartz boat until the powder is completely melted forming a thick film;
d. placing $Tl_2O_3$ in a platinum boat:
e. placing the platinum boat in the quartz boat;
f. placing the platinum substrate and molten powder over the platinum boat;
g. heating the quartz boat; and
h. cooling the quartz boat to room temperature producing a $Tl_2O_3$-vapor-processed $Ba_2Ca_2Cu_2O_7$ thick film.

21. A method for making high temperature superconductors comprising the steps of:
a. grinding a mixture of $BaCO_3$, CaO, and CuO and heating the ground mixture to obtain a uniform black Ba-Ca-Cu-O powder,
b. mixing a compound chosen form the group consisting of $In_2O_3$, $Tl_2O_3$, MgO, AgO, $K_2O$, $Na_2O$, $ZrO_2$, HgO, $Bi_2O_3$, and KCl, with the powder;
c. pressing the resulting mixture into a pellet:
d. heating the pellet;
e. cooling the pellet;
f. placing $Tl_2O_3$ in a platinum boat;
g. placing the platinum boat in a quartz boat;
h. putting the pellet over the platinum boat;
i. heating the quartz boat; and
j. cooling the quartz boat to room temperature.

22. A method for making high temperature superconductors comprising the steps of:
a. grinding a mixture of $BaCO_3$, CaO, and CuO and heating the ground mixture to obtain a uniform black Ba-Ca-Cu-O powder.
b. pressing the resulting Ba-Ca-Cu-O powder into a pellet;
c. heating the pellet;
d. cooling the pellet;
e. placing $Tl_2O_3$ in a platinum boat;
f. placing the platinum boat and pellet in a gold container;
g. sealing oxygen in the gold container;
h. heating the gold container; and
i. cooling the gold container-to room temperature.

* * * * *